(12) United States Patent
Furuyama

(10) Patent No.: US 8,044,483 B2
(45) Date of Patent: Oct. 25, 2011

(54) PHOTO DETECTOR AND OPTICALLY INTERCONNECTED LSI

(75) Inventor: Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/797,291

(22) Filed: Jun. 9, 2010

(65) Prior Publication Data

US 2010/0244170 A1 Sep. 30, 2010

Related U.S. Application Data

(62) Division of application No. 11/610,151, filed on Dec. 13, 2006, now Pat. No. 7,768,689.

(30) Foreign Application Priority Data

Mar. 14, 2006 (JP) ................................. 2006-069535

(51) Int. Cl.
*H01L 31/101* (2006.01)
(52) U.S. Cl. .. 257/462; 257/465; 257/466; 257/E25.032
(58) Field of Classification Search .................. 257/462, 257/465, 466, E25.032
See application file for complete search history.

(56) References Cited

U.S. PATENT DOCUMENTS

| | | | |
|---|---|---|---|
| 4,857,982 A * | 8/1989 | Forrest | 257/186 |
| 6,587,494 B2 | 7/2003 | Hatakoshi et al. | |
| 7,245,808 B2 * | 7/2007 | Sato et al. | 385/129 |
| 7,329,871 B2 | 2/2008 | Fan et al. | |
| 7,492,981 B2 | 2/2009 | Furuyama | |
| 7,697,799 B2 | 4/2010 | Furuyama | |
| 7,728,366 B2 * | 6/2010 | Oohashi et al. | 257/292 |
| 2005/0064303 A1 | 3/2005 | Yamada et al. | |
| 2005/0161589 A1 | 7/2005 | Kim et al. | |
| 2007/0069429 A1 | 3/2007 | Albrecht et al. | |
| 2007/0253051 A1 | 11/2007 | Ishihara et al. | |

FOREIGN PATENT DOCUMENTS

JP 7-22603 1/1995

(Continued)

OTHER PUBLICATIONS

Tineke Thio, et al., "Enhanced light transmission through a single subwavelength aperture", Optics Letters, vol. 26, No. 24, Dec. 15, 2001, pp. 1972-1974.

(Continued)

*Primary Examiner* — Kenneth Parker
*Assistant Examiner* — Jose R Diaz
(74) *Attorney, Agent, or Firm* — Oblon, Spivak, McClelland, Maier & Neustadt, L.L.P.

(57) ABSTRACT

A photo detector having an electrically conductive thin film and a light-receiving unit. A coupling periodic structure is provided on a surface of the film and converts incidence light to surface plasmon. The coupling periodic structure has an opening that penetrates the obverse and reverse surfaces of the thin film. The light-receiving unit is provided at one end of the opening in the surface that is opposite to the surface on which the coupling periodic structure is provided. The opening is shaped like a slit and is broader than half (½) the wavelength of the surface plasmon in a direction that intersects at right angles with a polarization direction of the incidence light and is narrower than half (½) the wavelength of the surface plasmon in a direction parallel to the polarization direction.

7 Claims, 5 Drawing Sheets

FOREIGN PATENT DOCUMENTS

| | | |
|---|---|---|
| JP | 2001-189519 | 7/2001 |
| TW | 200425492 A | 11/2004 |
| TW | 200425497 A | 11/2004 |
| TW | 200501135 A | 1/2005 |

OTHER PUBLICATIONS

Tsutomu Ishi, et al., "Si Nano-Photodiode with a Surface Plasmon Antenna", Japanese Journal of Appied Physics, vol. 44, No. 12, 2005, pp. L364-L366.

Kunihiko Ishihara, et al., "Terahertz Wave Enhanced Transmission through a Single Subwavelength Aperture with Periodic Surface Structures", Japanese Journal of Applied Physics, vol. 44, No. 32, 2005, pp. L1005 to L1007.

Zongfu Yu, et al., "Design of midinfrared photodetectors enhanced by surface plasmons on grating structures", Applied Physics Letters, vol. 89, issue 15, Oct. 9, 2006, pp. 151116-1 to 151116-3.

Liang Tang, et al., "C-shaped nanoaperture-enhanced germanium photodetector", Optics Letters, vol. 31, No. 10, May 15, 2006, pp. 1519-1521.

Office Action issued Nov. 24, 2010, in Japanese Patent Application No. 2006-069535 with Englisn translation.

* cited by examiner

ND OPTICALLY
PHOTO DETECTOR AND OPTICALLY INTERCONNECTED LSI

CROSS-REFERENCE TO RELATED APPLICATIONS

This application is a Divisional Application of U.S. application Ser. No. 11/610,151, filed Dec. 13, 2006, which is based upon and claims the benefit of priority from prior Japanese Patent Application No. 2006-069535, filed Mar. 14, 2006, the entire contents of which are incorporated herein by reference.

BACKGROUND OF THE INVENTION

1. Field of the Invention

The present invention relates to a photo detector having a plasmon focusing antenna, and to an optically interconnected LSI using such photo detectors.

2. Description of the Related Art

In recent years, the operating speed of large-scale integrated circuits (LSIs) has greatly increased, thanks to the improved performance of electronic devices such as bipolar transistors and field-effect transistors. The performance has been improved, owning to the decrease in transistor size. However, since the wires connecting transistors are now thin, the line resistance and the inter-line capacitance have increased, making great problems. These problems are a bottleneck of the improvement in LSI performance.

In view of the problem resulting from electric wires, some types of optically interconnected LSI, in which the components are interconnected by optical lines, have been proposed. Power loss in optical lines has virtually no dependence on frequency, ranging from direct current to 100 GHz or more. Further, the optical lines impose virtually no electromagnetic interference. Lines several 10 Gbps or more can therefore be realized easily.

The optical lines in an LSI need high-speed photo detectors made of silicon (Si), i.e., the substrate material of the LSI. Si is an indirect transition semiconductor, and its optical absorption efficiency is generally low. Inevitably it can hardly achieve both high light-receiving efficiency and high operating speed.

To solve this problem, photo detectors of plasmon focusing antenna type are known. Any element of this type utilizes a surface plasmon that propagates in the surface of an electrically conductive member made of, for example, metal. (See Japanese Journal of Applied Physics, Vol. 44, No. 12, and p. L364 (2005), hereinafter referred to as Document 1.) Light focusing and light passage through a small opening, both achieved by surface plasmon, are known in the art. (See Optics Letters, Vol. 26, No. 24, and p. 1972 (2001), referred to as Document 2.) On the other hand, in laser elements that differ from the photo detectors of plasmon focusing antenna type, a small asymmetrical opening may be used to improve the efficiency of transmitting light through a small opening. (See JP-A 2001-189519 (KOKAI), referred to as Document 3).

In the technology disclosed in Document 1, photoelectric conversion must be performed immediately after the light focused by the plasmon focusing antenna passes through the small opening. That is, a light-receiving Si layer must be arranged at the exit of the small opening in order to accomplish the photoelectric conversion. If the small opening is long (the length is equivalent to the thickness of an electrically conductive thin film), the light will be greatly attenuated as it passes through the small opening. Therefore, the electrically conductive thin film constituting the plasmon focusing antenna must be thin, but not so thin to allow the passage of light.

Hence, to apply optical lines to LSIs, one of the following two methods should be used. In one method, photo detectors of plasmon focusing antenna type are formed in transistor-forming surface (i.e., surface of the SI substrate). In the other method, photo detectors of focusing antenna type are formed on the multilayer interconnection lines of the LSI, and signals these elements have generated through photoelectric conversion are transferred via electric lines.

However, the method, in which photo detectors of plasmon focusing antenna type are formed in a transistor-forming surface, will reduce the number of transistors than can be formed in unit area of the LSI. Since method impairs the essential function of the LSI, it is not practical. The method, in which photo detectors of focusing antenna type are formed on LSI multilayer interconnection lines and electric wiring from these elements the surface of the Si substrate, is likely to make problems, such as signal degradation due to parasitic LCR in the electric lines, an increase in noise, and crosstalk to the other electric lines. In other words, the optical lines may impair the high operating speed.

In the method disclosed in Document 2, it is desirable to make the opening smaller in order to achieve a high-speed response.

If the opening is made smaller, however, the amount of light that passes through the surface plasmon may decrease.

BRIEF SUMMARY OF THE INVENTION

According to an aspect of this invention, there is provided an electrically conductive thin film which has an first surface, a second surface opposite to the first surface and a coupling periodic structure provided on the first surface, the electrically conductive thin film configured to convert incidence light to surface plasmon and including an opening penetrating the first surface and the second surface within the coupling periodic structure, and the opening being formed of a slit having a length longer than half a wavelength of the surface plasmon in a direction that intersects at right angle with a polarization direction of the incidence light and a width narrower than half the wavelength of the surface plasmon in a direction that is parallel to the polarization direction; and a light-receiving unit configured to receive the surface plasmon and arranged at one end of the opening in the second surface.

DETAILED DESCRIPTION OF THE INVENTION

Figure 1:
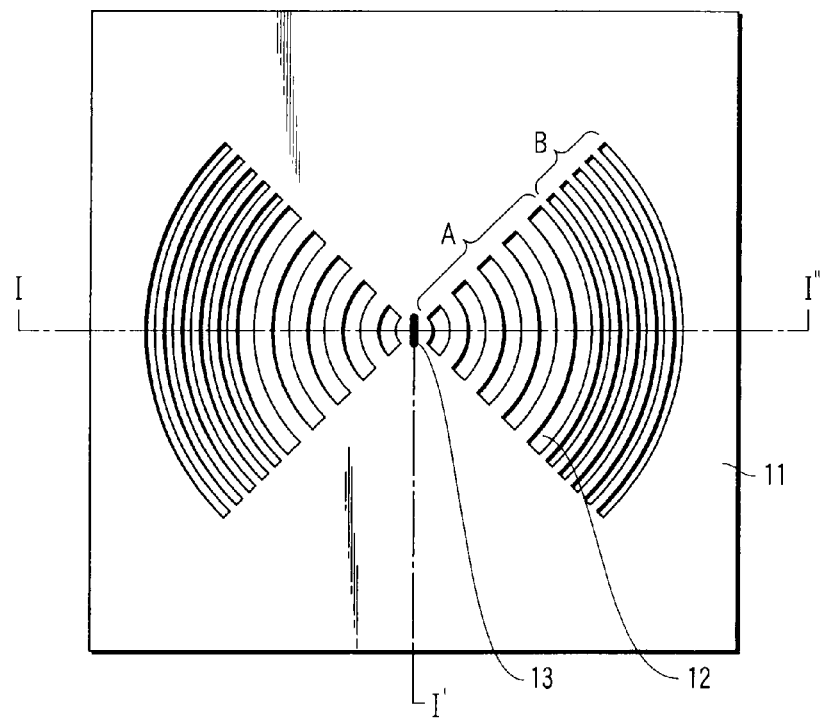
FIG. 1 is a plan view showing the configuration of the plasmon focusing antenna used in a photo detector according to a first embodiment.

The gist of the present invention is to provide a plasmon focusing antenna for receiving light, on the multilayer interconnection of an LSI, or in the multilayer interconnection of the LSI. The surface plasmon focused is transmitted to the surface of the Si substrate by a waveguide having a small opening. Light is thereby applied there (and undergoes photoelectric conversion).

Generally, the amount of light passing though an opening smaller than the wavelength of the light drastically decreases as the size of the opening decreases. Therefore, in the present invention, incident light is focused in a specific polarization direction, and polarization selection transmission is performed by using an asymmetrical opening. Alternatively, the light is focused in a specific direction) in non-selection manner, and a synthetic opening composed of asymmetrical openings that intersect with each other at right angles performs separation and transmission of polarized light.

Hereinafter, the present invention will be described in detail, with reference to the embodiments shown in the accompanying drawings.

The invention will be described on the assumption that Si is used as light-receiving material. Nevertheless, the invention can be similarly reduced to practice if the light-receiving unit (photoelectric transducer unit) has light-receiving material such as SiGe, SiC, GaAs, InP, GaInAs, GaInAsP, AlGaAs, or the like. Only one photo detectors (optically connected receiving section) is shown here. In practice, however, a number of photo detectors are integrated and formed on an LSI chip. The photo detectors and the optical lines connecting these elements are used in any numbers desired.

First Embodiment

There will be described the plasmon focusing antenna unit used in a photo detector according to a first embodiment referring to FIG. 1.

In FIG. 11, number 11 denotes an electrically conductive thin film, number 12 indicates a concentric circular periodic structure (a partially dug pattern), and number 13 designates an opening. The opening 13 penetrates the electrically conductive thin film 11, extending from the upper surface to the lower surface. The concentric circular periodic structure 12 is a partially dug pattern that has been made by etching parts of the surface of the electrically conductive thin film. The inner region (A) of the concentric circular periodic structure 12 is a joint periodic structure that couples the light applied perpendicular to the plane of the drawing, to the surface plasmon. The outer region (B) of the concentric circular periodic structure 12 is a reflective periodic structure that performs Bragg reflection on that component of the surface plasmon thus coupled by the joint periodic structure (A), which is emitted outwards from the element, thereby applying this component back to the inner region.

The electrically conductive thin film 11 may be made of metal such as Ag, Au, Cu, Al, Ni, Pd, Pt, W, Ti, Cr or Mo. It may be formed by a method such as sputtering, heating vapor deposition, or the like. The electrically conductive thin film 11 is made of Ag and formed on the surface of the Si substrate for forming a photo detector, which will be described later. The film 11 is, for example, 100 nm think.

The concentric circular periodic structure 12 should have a cycle fit for the wavelength of the light it has received. Cycle Pc of the joint periodic structure (A) is approximated as:

$$Pc \approx \lambda (1/\epsilon 1 + 1/\epsilon 2)^{1/2}$$

where $\lambda$ is the wavelength of light received, $\epsilon 1$ is the dielectric constant of the electrically conductive thin film 11, and $/\epsilon 2$ is the dielectric constant of the material contacting the electrically conductive thin film.

Cycle Pb of the reflective periodic structure (B) may be set to:

$$Pb = Pc/2.$$

As an example, a concentric circular periodic structure was made at the depth of 50 nm as shown in FIG. 1, using a focused ion beam (FIB) device in the surface of an electrically conductive thin film 11 (Ag-layer thickness of 100 nm). When air was at the surface of the electrically conductive thin film 11, Pc was set to 840 nm (Pb=420 nm). When a SiO$_2$ passivation film about 1 μm thick was formed on the surface of the electrically conductive thin film 11, Pc was set to 560 nm (Pb=280 nm). In either case, the center wavelength $\lambda$ at which light could be received will be in the vicinity of 850 nm. As shown in FIG. 1, the concentric circular periodic structure 12 consists of two symmetrical sectors whose center is the opening 13 and whose opening angle is 45°. This shape is equivalent to a shape defined by first dividing the concentric circular periodic structure 12 into four segments and then discarding every other segment.

Since the structure 12 is so shaped, the light polarized along the axis of the sectors (i.e., the left-to-right direction in FIG. 1) is converted to surface plasmon. The component of light, which is polarized in the direction intersecting at right angles with that axis is not focused. This means that the light component coming through the opening 13 made in the center of the film 11 is polarized along the axis of the sectors and can be selectively received. To ensure the separation of the polarized components of light, it is necessary only to discard the light coming at a sector angle of about 45°. For this purpose, the opening angle of each sector shown in FIG. 1 needs only to be set to, for example, 30°.

The opening 13 shown in FIG. 1 should be so small that the light-receiving layer that performs photoelectric conversion on the coming light may be limited to a sufficiently small region. As standard, the opening 13 is a little longer than half (½) the plasmon wavelength in the direction intersecting at right angles to the axis of the sectors shown in FIG. 1, and shorter than half (½) the plasmon wavelength in the direction parallel to the axis of the sectors. That is, the opening 13 is shaped like a slit relevant to the polarization in which the incidence light is polarized. Strictly speaking, the plasmon wavelength $\lambda p$ is the plasmon wavelength in the opening strictly. Nevertheless, it is almost the same as the above-mentioned Pc (equivalent to the plasmon wavelength at the surface of the plasmon focusing antenna). For this reason, the short sides (extending in polarization direction) of the opening 13 may be considerably shorter than Pc/2 if its long sides (extending at right angles to the polarization direction) are equal to or longer than Pc/2.

If $\lambda \cong 850$ nm, for example, a $SiO_2$ passivation film about 1 µm thick may be formed on the surface of the electrically conductive thin film 11. In this case, the long sides (extending at right angles to the polarization direction) of the opening 13 are 280 nm or more long (for example, 400 nm long), and the short sides of the opening 13 are 280 nm or less long (for example, 100 nm long). The opening 13 is a hole that penetrates the electrically conductive thin film 11. If the Ag thickness is 100 nm as described above, a groove that is 400 nm long and 100 nm wide may be made to the depth of 100 nm by means of FIB.

This configuration can decrease the propagation loss in the opening 13, because of the principle disclosed in Document 3. Even if only the part having the opening 13 is formed thick, the plasmon attenuation in the opening 13 can be greatly suppressed. Assume that the part having the opening 13 has a thickness (opening length) of 1 micron. Then, the transmissivity of the polarized light at right angles to the long sides of the slit-shaped opening (400 nm×100 nm) is estimated at about 41%. On the other hand, the transmissivity of the polarized light parallel to the long sides of the slit-shaped opening was substantially zero (to $1 \times 10^{-18}$). Transmissivity of about 6% can be secured for the polarized light at right angles to the long sides of the slit-shaped opening (400 nm×100 nm) also considering the thickness (opening length) even if the opening 13 is 10 micrometers thick (or long).

Transmissivity at, for example, an opening (diameter: 226 nm) having the same area as the slit-shaped opening is estimated to be $2 \times 10^{-9}$, or almost zero if the opening length is 1 micron. Thus, the thickness or diameter of the opening should be large in the conventional technology. If the part having the above-mentioned circular opening is 100 nm thick, the transmissivity will be about 16%. If the part having the opening is 1 micrometer thick and the opening has a diameter of 500 nm, transmissivity of about 80% can be attained. In this case, however, that effective opening area is as large as about five times that of the slit-shaped opening 5 of the present embodiment.

To provide a circular opening as large as 500 nm across, a conductive pillar having a larger diameter (e.g., 800 nm) is required. Once the antenna unit has been mounted on a LSI, which will be described later, it imposes prominent limitation to the layout of multilayer interconnection and the arrangement of transistors. Further, the integration density of transistors in the light-receiving unit decreases, which results in the transistor density of the LSI. Still further, if the area of a photo detector becomes large with size increase of the opening system, and if a photodiode is formed of a pn junction, a high-speed response will hardly be achieved, because the junction capacitance is large.

Hence, the long sides of the opening 13 should extend at right angles to the direction in which the incidence light is polarized, in the present embodiment (FIG. 1). To fulfill this condition, use is made of the plasmon focusing antenna that comprises sector-shaped parts as described above. If a conventional plasmon focusing antenna having perfectly concentric circle parts is used in place of the above-described antenna having a slit-shaped opening 13, the following problems will arise. That is, polarized light components parallel to the long sides of the slit-shaped opening cannot enter the opening 13. These components are reflected many times and confined by a reflective periodic structure (B) until they are attenuated by scattering or absorption on the plasmon focusing antenna. In this case, a part of the scattered surface plasmon will be a component that can enter the slit-shaped opening 13 and will become delayed incidence light. The delayed incidence light will degrade the waveform received and increase the noise.

Figure 2:
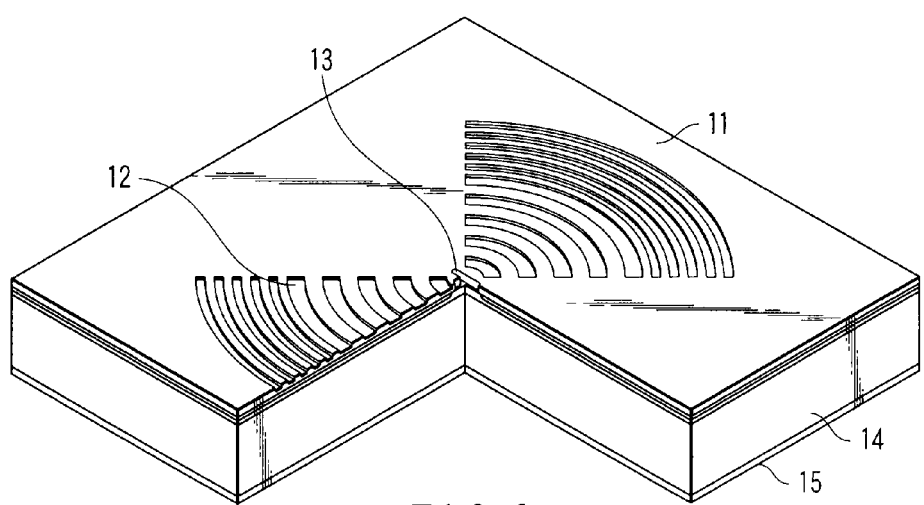
FIG. 2 is a partly cutaway, perspective view showing the configuration of the photo detector according to the first embodiment.
Figure 3:
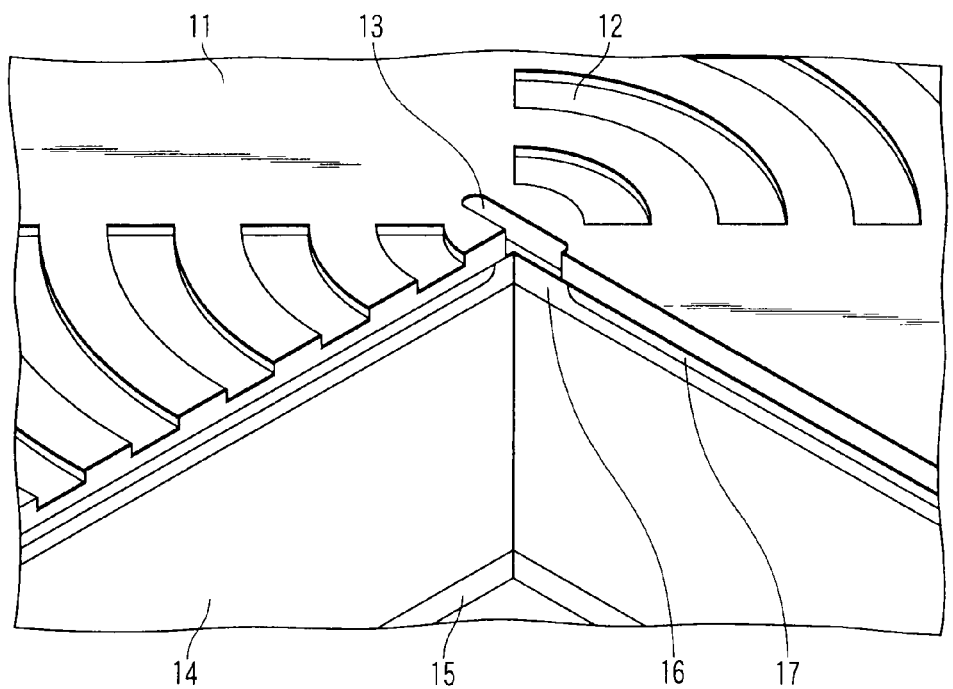
FIG. 3 is a magnified perspective view showing the main section of the photo detector concerning to the first embodiment.
Figure 4:
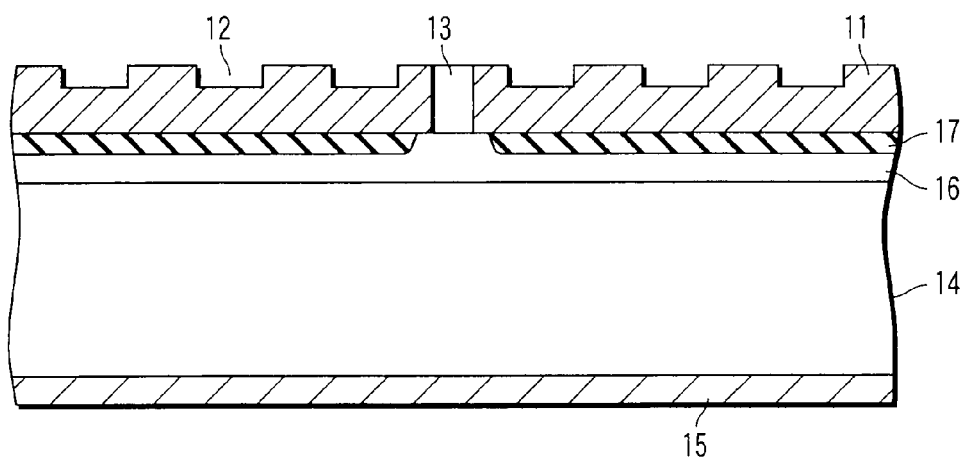
FIG. 4 is a sectional view showing the configuration of the photo detector according to the first embodiment.

A photo detector that has a plasmon focusing antenna of the type shown in FIG. 1 will be described in detail, with reference to FIGS. 2 to 4. FIGS. 2 and 3 are perspective views, each not showing a quarter cut away along lines I-I and taken along part I-13-I' shown in FIG. 1. In FIGS. 2 and 3, number 14 denotes an n-type Si substrate, number 15 indicates a back electrode (made of, for example, Al), number 16 designates a low-concentration Si layer, and number 17 denotes a $SiO_2$ thermally oxidized film. FIG. 4 is a sectional view taken along part I-I" shown in FIG. 1.

Although not shown in FIGS. 2 to 4, a $SiO_2$ passivation film may be formed on the electrically conductive thin film 11. In that case, the function becomes equivalent by changing the cycle of concentric circular periodic structure 12.

The plasmon focusing antenna is manufactured as will be described below. On the low concentration Si layer 16 and the $SiO_2$ oxidizing film 17, for example, a Ti film (not shown) 10 nm thick is formed. The Ti film functions as a Schottky electrode for the low-concentration Si layer 16, and as a metal layer firmly contacting the $SiO_2$ thermally oxidized film 17. An electrically conductive thin film 11 made of Ag and having a thickness of 100 nm is formed on the Ti film. Then, a slit-shaped opening 13, which has a size of 400 nm×100 nm, is made in the electrically conductive thin film 11. Further, a concentric circular periodic structure 12 having a depth of 50 nm is fabricated. A joint periodic structure A (for example, ten cycles) is arranged in the same way as shown in FIG. 1. A reflective periodic structure B (for example, five cycles) is arranged outside the joint periodic structure A.

Assume that the light received has a wavelength of 850 nm. Then, the periodic structure has a diameter of about 14 µm for a passivation type element (Pc=560 nm). The light-receiving region has a diameter of 11 µm). The light transmitted through a single-mode optical fiber can be received by means of bat joint coupling. The light-receiving layer 16 is, for example, 2 µm thick. The thermally oxidized $SiO_2$ film 17 that is 2 µm thick is formed on the light-receiving region. The low-concentration Si layer 16, except the light-receiving part (located below the opening 13), have its upper part (about 1 micron thick) becomes a thermally oxidized $SiO_2$ film 17. The remaining part of the Si layer 16 is about 1 micron thick.

This configuration provides a photo detector having good characteristics, such as light-receiving efficiency of about 10% (photoelectric conversion coefficient of 0.08 A/W) and response speed of 15 GHz or more.

Thus, in this embodiment, the photoelectric conversion area of the photo detector can be far smaller than the area of the light-receiving antenna (i.e., plasmon focusing antenna), or considerably smaller than that of a circle whose diameter is the wavelength of the light received. Further, the opening 13 for allowing the passage of surface plasmon is shaped like a slit and can therefore be smaller than a circular opening of the same diameter, without causing a decrease in the amount of light transmitted. This can improve the response speed. Hence, this embodiment can provide a photo detector that excels in light-receiving efficiency and response speed.

Second Embodiment

There will be described the plasmon focusing antenna unit used in a photo detector according to a second embodiment referring to FIG. 5. The components 21 to 23 shown in FIG.

5 are equivalent to the components 11-13 shown in FIG. 1, respectively, and will not be described.

In the first embodiment described above, a part of the incidence light, which has been polarized in a specific direction, is focused, and an asymmetrical opening (i.e., slit) performs selective transmission of polarized light. In the present embodiment, the polarization direction is focused (the incidence light is focused in non-selection manner, that is, light polarized in any direction is focused), and a synthetic opening composed of asymmetrical openings (slits) that intersect with each other at right angles performs separation and transmission of polarized light.

Figure 5:
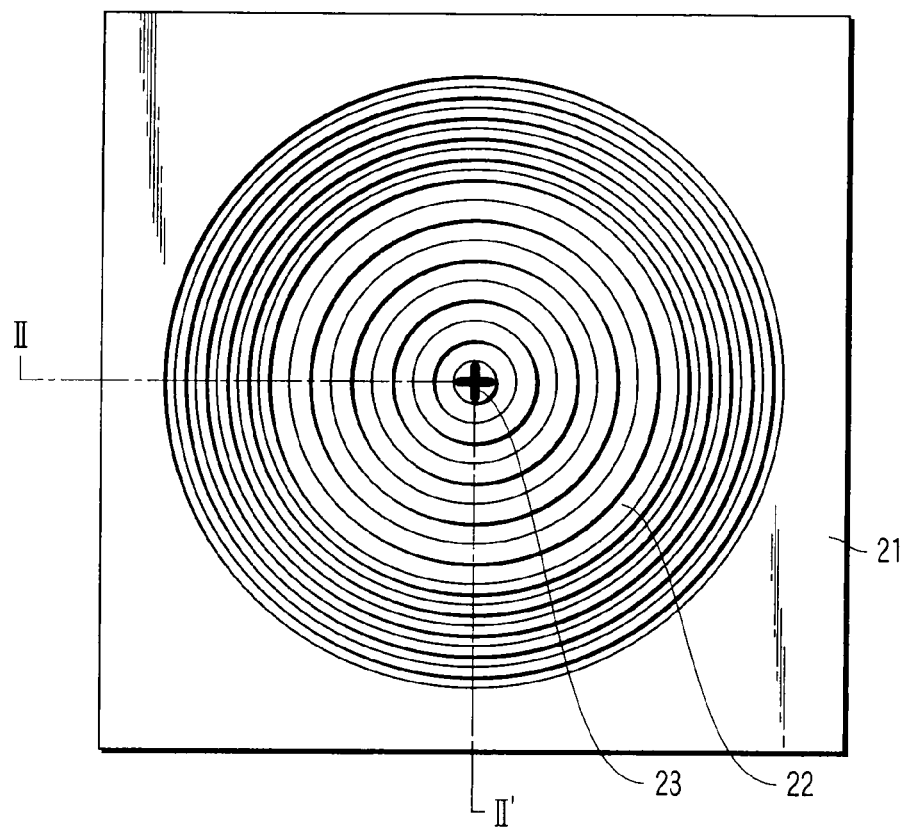
FIG. 5 is a plan view showing the configuration of the plasmon focusing antenna used in a photo detector according to the second embodiment.

That is, two antenna-slit assemblies, each being of the type shown in FIG. 1 are combined, with the slits intersecting with each other at right angles, at their mutual center, as is illustrated in FIG. 5. As a result, the slits form a cross-shaped opening 23 that differs from the opening of the conventional plasmon focusing antenna, though the second embodiment is a concentric circular periodic structure like the conventional plasmon focusing antenna. The long sides of the slits constituting the cross-shaped opening 23 are longer than half (½) the wavelength of surface plasmon, and the short sides of these slits are shorter than half (½) the wavelength of the surface plasmon.

The cross-shaped opening 23 is characterized in that the inter-top distance (top length measured along the long sides of the slits) is equal to or longer than half the plasmon wavelength. Hence, the opening can maintain high transmissivity even if the cross-shaped slit has a width (measured along the short sides of the slits) is considerably smaller than half the plasmon wavelength.

The principle of this is basically the same as that of the slit-shaped opening and can be easily understood if the cross-shaped opening is divided into two slit-shaped openings. That is, each slit has high transmissivity to light polarized in a specific direction and a low transmissivity to light polarized in the direction at right angles to the specific direction. However, since the slits intersect with each other at right angles, a light beam polarized in both directions that enters the opening 23 is split into components that can easily transmitted through the slits, respectively. These components of light pass through the two slits, respectively. As a result, the light beam passes through the opening, regardless of the polarization direction.

Consider a polarized light beam inclined at 45° to the long sides of one of the slits defining the cross-shaped opening. If only one slit is provided, one half of the light passes through the opening. The other half of the light is repeatedly reflected in the plasmon focusing antenna and is eventually dispersed or absorbed. However, since another slit intersecting with the slit at right angles is provided, the other half of the light fast enters the other slit. As a result, two surface plasmons of the light components that intersect with each other pass through the two slits, respectively, reaching the other side of the cross-shaped opening. At the exit of the cross-shaped opening, the light components are synthesized, whereby the original surface plasmon is restored.

Thus, transmissivity as high as that of a circular opening larger than half the plasmon wavelength can be attained if the inter-top distance of the cross-shaped slit is equal to or longer than half the plasmon wavelength and if the slit width is sufficiently reduced, thus decreasing the area of the opening. In addition, a photo detector can be provided, which has a small light-receiving area, little depends on the polarization direction of incidence light and operates at high speed.

Figure 6:
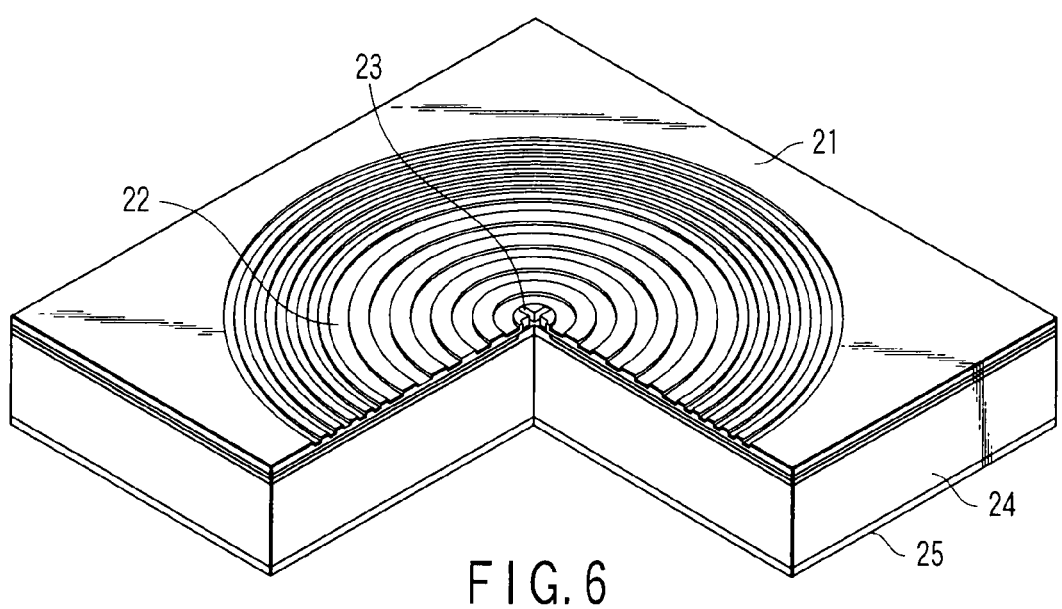
FIG. 6 is a partly cutaway, perspective view showing the configuration of the photo detector according to the second embodiment.
Figure 7:
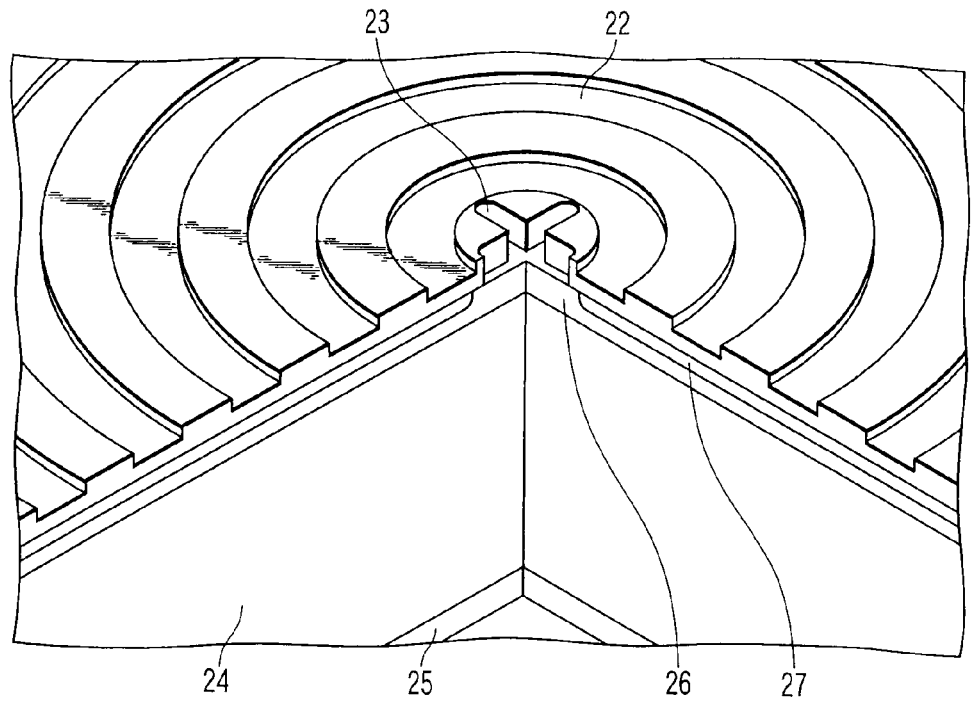
FIG. 7 is a magnified perspective view showing the important section of the photo detector concerning the second embodiment.

FIGS. 6 and 7 are perspective views, each not showing a quarter cut away along lines I-I and taken along part I-13-I' shown in FIG. 5. The components 21 to 25 shown in FIGS. 6 and 7 are equivalent to the components 11-15 shown in FIG. 3, respectively.

This plasmon focusing antenna is manufactured as will be explained below. A Ti film 10 nm thick (not shown), for example, is formed on a low-concentration Si layer 26 and a $SiO_2$ thermally oxidized film 27. The Ti film functions as a Schottky electrode for the low-concentration Si layer 26, and as a metal layer firmly contacting the $SiO_2$ thermally oxidized film 27. An electrically conductive thin film 21 made of Ag and having a thickness of 100 nm is formed on the Ti film. Then, a cross-shaped opening 23 is made, which has an inter-top distance of 20 nm and a slit width (line width) of 100 nm. Further, a concentric circular periodic structure 22 that is 50 nm deep is formed, thus arranging a joint periodic structure A (for example, ten cycles) as shown in FIG. 1. A reflective periodic structure B (for example, five cycles) is arranged outside the structure A and concentric to the structure A, as is illustrated in FIG. 5.

If the light received has wavelength of 850 nm, the element is a $SiO_2$ passivation-type one (Pc=560 nm) and has a periodic structure having a diameter of about 14 micrometers. The diameter of the light beam received is about 11 micrometer. The light can be received via single-mode optical fibers that are butt-jointed. The light-receiving layer 26 is, for example, 2 micrometers thick, and the thermally oxidized $SiO_2$ film 27 defining the light-receiving region is 2 micrometers thick. As a result, the low-concentration Si layers 26, except the light-receiving part (located below the opening 23), is thermally oxidized to the depth of about 1 micrometer, forming the thermally oxidized $SiO_2$ film 27. The thickness of the Si layer 26 decreases to about 1 micrometer.

Having the configuration described above, the photo detector has light-emitting efficiency of 10% (photoelectric conversion coefficient of 0.08 A/W) and a response speed of 15 GHz or more, which do not depend on the direction in which the incidence light is polarized. The cross section of the opening 23 is about twice as much as in the first embodiment, and the light-receiving area is also about twice as much. Nonetheless, the parasitic capacitance of the element is small enough. The element has a response speed similar to that of the first embodiment, because the response characteristic of the photo detector depends on the time the carriers need to pass through the Si layer 26. Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

Third Embodiment

Figure 8:
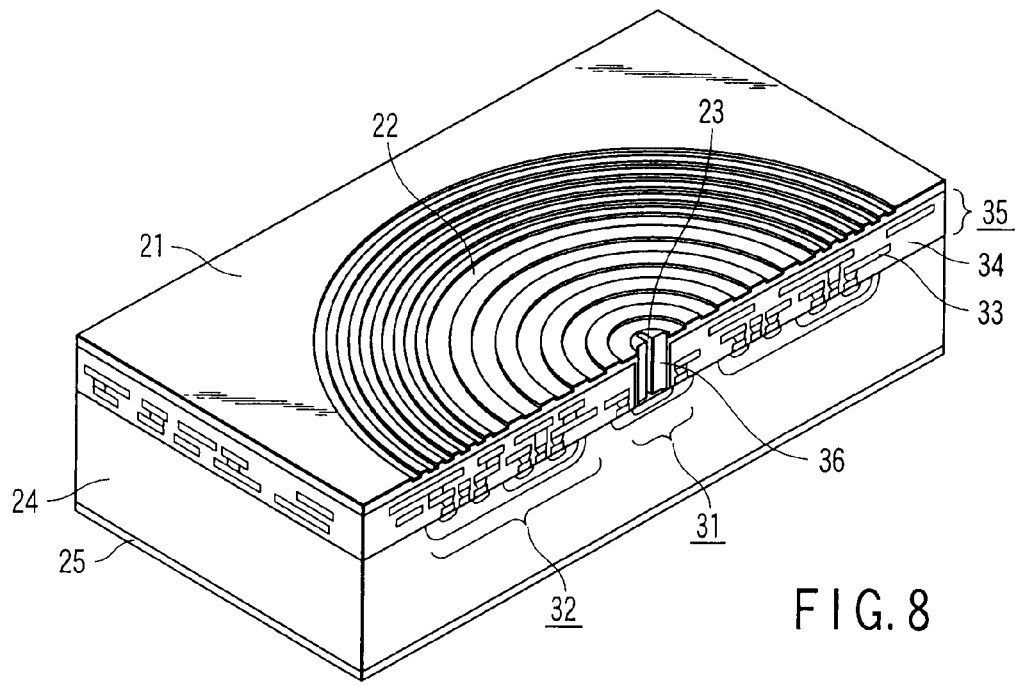
FIG. 8 is a partly cutaway, perspective view showing the configuration of an optically interconnected LSI according to a third embodiment.
Figure 9:
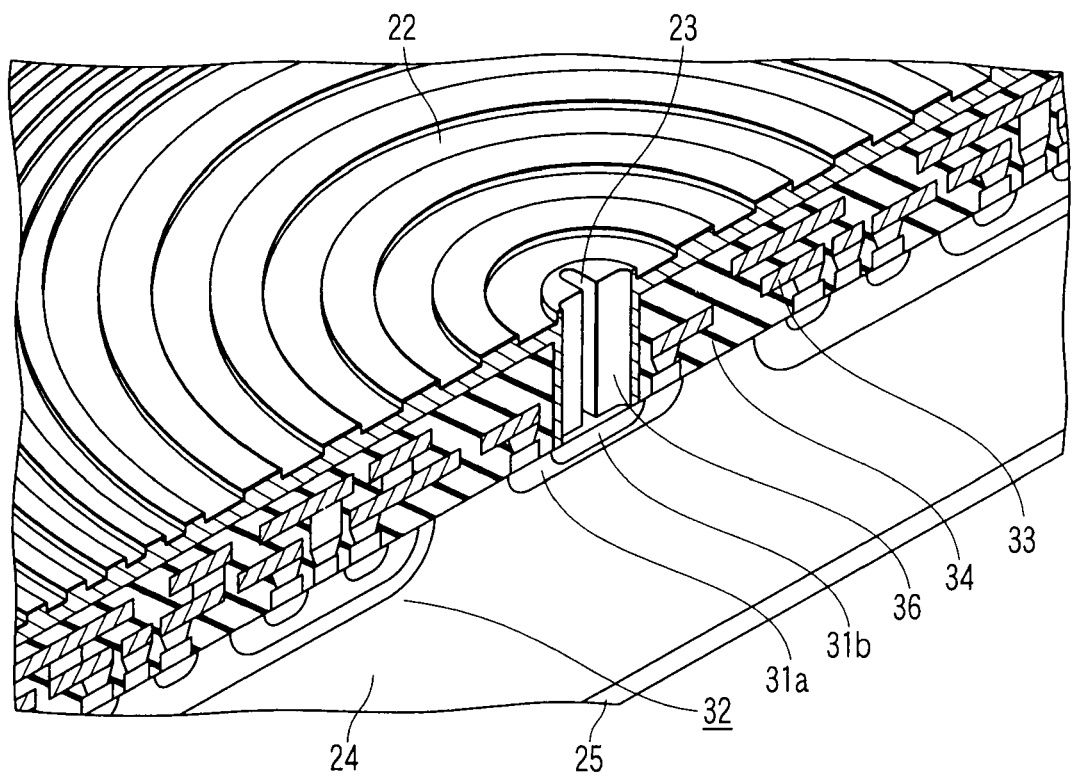
FIG. 9 is a magnified perspective view showing the important section of the optically interconnected LSI according to the third embodiment.

FIGS. 8 and 9 are perspective views showing the configuration of an optically interconnected LSI according to a third embodiment of the present invention. The components identical to those shown in FIGS. 6 and 7 are designated with the same reference numbers in FIGS. 8 and 9, and will not be described.

In FIG. 8, number 31 designates a semiconductor light-receiving unit, number 32 indicates CMOS transistors, number 33 designates Cu lines, number 34 indicates an interlayer insulating film, number 35 designates a multilayer interconnection structure, and number 36 denotes pillar-shaped conductor (metal pillar). This embodiment constitutes an optically interconnected LSI, using a photo detector that has a cross-shaped opening of the type shown in FIGS. 6 and 7 and therefore has no polarization dependency. In FIG. 9, number 31a denotes a p-type well, and number 31b an n-type light-receiving layer. P type well 31a is a reversal conduction well and is electrically isolated from the n-type substrate 24.

The opening (cross-shaped) 23 penetrates the multilayer interconnection structure 35. Thus, a surface plasmon from a plasmon focusing antenna can be transmitted through this opening 35. Therefore, the metal pillar (conductive pillar) 36, which is thicker than a focusing antenna, extends to the surface of the Si substrate. Since opening 23 is shaped like a cross, the metal pillar 36 penetrating the multilayer interconnection structure 35 has a cross section shaped like a cross. Therefore, the metal pillar 36 does not occupy such a large layout area as a metal pillar having a circular cross section. The metal pillar can be embedded in the multilayer interconnection structure 35 or in the gap at the boundary between sections (square regions) of the transistor layout section.

The metal pillar 36 provided in the multilayer interconnection structure 35 and having a cross section shaped like a cross may be made of Cu that is the material of the multilayer interconnection. However, Cu involves a comparatively large absorption loss. Thus, the pillar 36 should better be made of Ag, if possible. In that case, after the multilayer interconnection is formed, a cross-shaped groove is made, penetrating the interlayer insulation film 34 and some of the Cu lines 33 (e.g., bias lines of the photo detector). The groove is filled with Ag, thereby forming a metal pillar 36 having a cross section shaped like a cross. Then, a plasmon focusing antenna is formed and a cross-shaped opening may be made by dry etching.

The multilayer interconnection of LSI is generally about 10 micrometers thick, and the plasmon transmission distance of the cross-shaped opening is around 10 micrometers. In order to reduce the transmission loss, it is desired that the opening be sufficiently large, unlike in the first embodiment where the opening penetrates the conductive film 22 only. For example, incidence light having wavelength of 850 nm may be transmitted for 10 micrometers through an Ag waveguide having a cross-shaped opening 23 on Ag that has inter-top distance of 450 nm and a cross-groove width of 200 nm. Then, transmission efficiency of about 20% can be attained. The effective area product at this time (acceptance surface product) is the area 420 nm in diameter about a circular opening, and does not turn into area to the extent that the speed of response of a photo detector is reduced from about 15 GHz.

Therefore, this embodiment can be fully restored with a gain attained by using only one or two transistors, even if the surface plasmon is transmitted from the uppermost LSI multilayer interconnection lines to the surface of the SI substrate. In addition, the embodiment is advantageous because it can operate at high speed (using, for example, 10 GHz clock), thanks to the optical interconnection, without degrading the wave shape or increasing the superfluous jitter.

Thus, this embodiment can of course achieve the same advantage as the second embodiment. Further, the light-receiving antenna can be positioned away from the LSI region in which transistors are provided. Hence, optical interconnection can be used, almost not lowering the integration density of transistors, and the restriction on the layout of multilayer interconnection can reduced very much. The photo detector, or photoelectric conversion unit, can be formed in a narrow gap in the transistor region (Si substrate) of the LSI. The photo detector can therefore be almost directly connected to the transistors. Therefore, the element is scarcely degraded, or the noise will scarcely increase. High-speed optical lines can effectively be constituted in the LSI chip, enabling the LSI chip to operate at high speed and high efficiency. The photo detector can much contribute to the sophistication of data communications apparatuses.

That is, a high-speed optical interconnection can be accomplished in the LSI chip. The LSI configuration is simple, signals are not degraded, and no crosstalk occurs. Moreover, an optically interconnected LSI which does not spoil the rapidity of an LSI degree of location or an optical line is realizable.

(Modifications)

The present invention is not limited to the embodiments described above. The embodiments described above are no more than configuration examples. Other means (materials, sizes etc.) can be used in accordance with the spirit of the present invention.

The materials, shapes, arrangements, etc. which were shown in the embodiments are merely examples. Further, the embodiments may be reduced to practice in any possible combination. In the first embodiment, for example, the photo detector much depends on polarized light and becomes sensitive to the dislocation of the polarization plane. This may be positively utilized. That is, two photo detectors according to the first embodiment are prepared and arranged, one intersecting at right angles with the other. Thus, light beams polarized, multiplexed and applied at a time can be polarized and separated.

The opening need not be left void. It may be filled with dielectric material such as $SiO_2$ or SiN. The light-receiving unit is not limited to a photodiode. Instead, it may be a phototransistor. Moreover, a photoelectric conversion member may be used, which converts light into electric signals.

Additional advantages and modifications will readily occur to those skilled in the art. Therefore and the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. An optically interconnected LSI comprising:
a semiconductor substrate which has a main surface;
a transistor unit configured to be integrally formed on the main surface of the semiconductor substrate;
a multilayer-interconnection structure unit which is provided on the transistor unit;
an electrically conductive thin film which is provided on the multilayer-interconnection structure unit and has an upper surface, a lower surface, a coupling periodic structure formed on the upper surface, and an opening penetrating the upper surface and the lower surface, the opening being formed of a slit having a length longer than half a wavelength of a surface plasmon converted from incident light in a direction that intersects at a right angle with a polarization direction of the incident light and a width narrower than half the wavelength of the surface plasmon in a direction that is parallel to the polarization direction;
an electrically conductive pillar having upper and lower surfaces and configured to penetrate the upper and lower surfaces of the multilayer-interconnection structure unit and has a waveguide opening penetrating the upper and lower surfaces of the electrically conductive pillar, an end of the waveguide opening communicating with the opening of the electrically conductive thin film; and a semiconductor light-receiving unit which is provided on the surface of the semiconductor substrate and located at the other end of the waveguide opening of the electrically conductive pillar.

2. The optically interconnected LSI according to claim 1, wherein the opening and has long sides longer than half (½) the wavelength of the surface plasmon and short sides shorter than half (½) the wavelength of the surface plasmon, and the coupling periodic structure is a concentric circular structure using the opening as center and is selectively provided in sector-shaped regions symmetrically extending from the opening along the short sides of the opening.

3. The optically interconnected LSI according to claim 2, further comprising a reflective periodic structure which is formed outside the coupling periodic structure on the surface of the electrically conductive thin film, and has a concentric circular structure using the opening as center, the reflective periodic structure reflecting and confining the surface plasmon.

4. The optically interconnected LSI according to claim 3, wherein the coupling periodic structure and the reflective periodic structure are dug patterns made by etching parts of the surface of the electrically conductive thin film.

5. The optically interconnected LSI according to claim 1, wherein the opening is shaped like a cross and defined by two slits intersecting with each other at a right angle, each slit having long sides longer than half (½) the wavelength of the surface plasmon and short sides shorter than half (½) the wavelength of the surface plasmon, and the coupling periodic structure is a concentric circular structure using the opening as center.

6. The optically interconnected LSI according to claim 5, further comprising a reflective periodic structure which is formed outside the coupling periodic structure on the surface of the electrically conductive thin film, and has a concentric circular structure using the opening as center, the reflective periodic structure reflecting and confining the surface plasmon.

7. The optically interconnected LSI according to claim 6, wherein the coupling periodic structure and the reflective periodic structure are dug patterns made by etching parts of the surface of the electrically conductive thin film.

* * * * *